(12) United States Patent
Leeser et al.

(10) Patent No.: US 9,954,508 B2
(45) Date of Patent: Apr. 24, 2018

(54) MULTIPLE-OUTPUT RADIOFREQUENCY MATCHING MODULE AND ASSOCIATED METHODS

(71) Applicant: Lam Research Corporation, Fremont, CA (US)

(72) Inventors: Karl Leeser, West Linn, OR (US); Sunil Kapoor, Vancouver, WA (US); Bradford J. Lyndaker, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 138 days.

(21) Appl. No.: 14/923,329

(22) Filed: Oct. 26, 2015

(65) Prior Publication Data

US 2017/0117869 A1 Apr. 27, 2017

(51) Int. Cl.
*H03H 7/38* (2006.01)
*H01J 37/32* (2006.01)

(52) U.S. Cl.
CPC ......... *H03H 7/38* (2013.01); *H01J 37/32183* (2013.01)

(58) Field of Classification Search
CPC ....... H03H 7/38; H03H 7/40; H01J 37/32183; H01L 21/67207
USPC ........................................................ 333/124
See application file for complete search history.

(56) References Cited

U.S. PATENT DOCUMENTS

| | | | |
|---|---|---|---|
| 6,538,388 B2 * | 3/2003 | Nakano | H01J 37/32082 315/111.21 |
| 2003/0098127 A1 * | 5/2003 | Nakano | H01J 37/32082 156/345.44 |

* cited by examiner

*Primary Examiner* — Robert J Pascal
*Assistant Examiner* — Kimberly Glenn
(74) *Attorney, Agent, or Firm* — Martine Penilla Group, LLP

(57) ABSTRACT

A matching module includes an input terminal connected to an input node, a variable load capacitor, and a plurality of RF signal delivery branches. The input terminal is connected to receive RF signals from one or more RF generators. The load capacitor is connected between the input node and a reference ground potential. Each of the plurality of RF signal delivery branches has a respective ingress terminal connected to the input node and a respective egress terminal connected to a respective one of a plurality of output terminals. Each of the plurality of output terminals of the matching module is connected to deliver RF signals to a different one of a plurality of plasma processing stations/chambers. Each of the plurality of RF signal delivery branches includes a corresponding inductor and a corresponding variable tuning capacitor electrically connected in a serial manner between its ingress terminal and its egress terminal.

24 Claims, 10 Drawing Sheets

US 9,954,508 B2

MULTIPLE-OUTPUT RADIOFREQUENCY MATCHING MODULE AND ASSOCIATED METHODS

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency of the RF power applied, and magnitude of the RF power applied, among others. Therefore, it is of interest to understand, monitor, and/or control some of the process parameters that may affect the characteristics of the generated plasma, particularly with regard to delivery of the RF power to the plasma generation region. It is within this context that the present invention arises.

SUMMARY

In one example embodiment, a matching module is disclosed. The matching module includes an input terminal connected to receive RF signals from one or more RF generators. The input terminal is connected to an input node. The matching module includes a load capacitor having a first terminal connected to the input node and second terminal connected to a reference ground potential. The load capacitor is configured as a variable capacitor. The matching module includes a plurality of RF signal delivery branches that each have a respective ingress terminal connected to the input node and a respective egress terminal connected to a respective one of a plurality of output terminals of the matching module. Each of the plurality of output terminals of the matching module is connected to deliver RF signals to a different one of a plurality of plasma processing stations/chambers. Each of the plurality of RF signal delivery branches includes a corresponding inductor and a corresponding tuning capacitor electrically connected in a serial manner between its ingress terminal and its egress terminal. Each tuning capacitor is configured as a respective variable capacitor.

In one example embodiment, a system for semiconductor substrate processing is disclosed. The system includes a plurality of plasma processing stations/chambers. Each of the plurality of plasma processing stations/chambers respectively includes an RF input line through which RF signals are transmitted to generate a plasma within the plasma processing station/chamber. The system includes an RF power source configured to generate RF signals for transmission to the RF input lines of the plurality of plasma processing stations/chambers. The system includes a matching module connected between the RF power source and the RF input lines of the plurality of plasma processing stations/chambers. The matching module includes an input terminal connected to receive RF signals from the RF power source. The input terminal is connected to an input node within the matching module. The matching module includes a load capacitor having a first terminal connected to the input node and second terminal connected to a reference ground potential. The load capacitor is configured as a variable capacitor. The matching module includes a plurality of RF signal delivery branches that each has a respective ingress terminal connected to the input node and a respective egress terminal connected to a respective one of a plurality of output terminals of the matching module. Each of the plurality of output terminals of the matching module is connected to deliver RF signals to the RF input line of a different one of a plurality of plasma processing stations/chambers. Each of the plurality of RF signal delivery branches includes a corresponding inductor and a corresponding tuning capacitor electrically connected in a serial manner between its ingress terminal and its egress terminal. Each tuning capacitor is configured as a respective variable capacitor. The system also includes an RF control module configured to transmit control signals to the matching module to control capacitance settings of the load capacitor and the tuning capacitors of the plurality of RF signal delivery branches.

In one example embodiment, a method is disclosed for distributing RF signals to a plurality of plasma processing stations/chambers. The method includes generating RF signals. The method also includes transmitting the generated RF signals to an input terminal of a matching module. The matching module includes an input node connected to the input terminal. The matching module also includes a load capacitor having a first terminal connected to the input node and second terminal connected to a reference ground potential. The load capacitor is configured as a variable capacitor. The matching module also includes a plurality of RF signal delivery branches that each has a respective ingress terminal connected to the input node and a respective egress terminal connected to a respective one of a plurality of output terminals of the matching module. Each of the plurality of output terminals of the matching module is connected to deliver RF signals to an RF input line of a different one of a plurality of plasma processing stations/chambers. Each of the plurality of RF signal delivery branches includes a corresponding inductor and a corresponding tuning capacitor electrically connected in a serial manner between its ingress terminal and its egress terminal. Each tuning capacitor is configured as a respective variable capacitor. The method also includes setting respective capacitance values of the load capacitor and each tuning capacitor of the plurality of RF signal delivery branches to provide a prescribed distribution of an RF signal delivery parameter at the egress terminals of the plurality of RF signal delivery branches. The RF signal delivery parameter is either power, phase, current, impedance, voltage, or any combination thereof.

In one example embodiment, a method is disclosed for balancing an RF signal delivery parameter among a plurality of plasma processing stations/chambers. The method includes operating an RF power source to generate RF signals. The method also includes connecting a matching module to distribute the RF signals to a plurality of plasma processing stations/chambers. The matching module includes an input node connected to receive the RF signals from the RF power source. The matching module also includes a load capacitor having a first terminal connected to the input node and second terminal connected to a reference ground potential. The load capacitor is configured as a variable capacitor. The matching module also includes a plurality of RF signal delivery branches that each has a respective ingress terminal connected to the input node and a respective egress terminal connected to a respective one of a plurality of output terminals of the matching module. Each of the plurality of output terminals of the matching module is connected to deliver RF signals to an RF input line of a different one of a plurality of plasma processing stations/chambers. Each of the plurality of RF signal delivery branches includes a corresponding inductor and a corresponding tuning capacitor electrically connected in a serial manner between its ingress terminal and its egress terminal. Each tuning capacitor is configured as a respective variable capacitor. The method also includes setting a capacitance value of the load capacitor and respective capacitance values of each tuning capacitor of the plurality of RF signal delivery branches such that an impedance of the matching module present at the input node substantially matches an impedance at an output of the RF power source. Each tuning capacitor is set to a same capacitance value. The method also includes iteratively adjusting the capacitance values of the tuning capacitors of the plurality of RF signal delivery branches to obtain a balance of an RF signal delivery parameter among the plurality of plasma processing stations/chambers, where the RF signal delivery parameter is either power, phase, current, impedance, voltage, or any combination thereof.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Multi-Station Sequential Deposition (MSSD) Plasma-Enhanced Chemical Vapor Deposition (PECVD) tools (and other plasma processing tools) introduce at least one RF source to a single RF matching network and distribute the RF signals to multiple process stations/chambers (generally four) via some RF distribution system separate from the RF matching network. The method of distributing the RF signals to multiple process stations/chambers depends on each leg of the RF distribution system being well-matched with regard to impedance. However, even if the multiple legs of the RF distribution system are well-matched, plasma impedances at each station/chamber may not be matched and power imbalance can occur from station/chamber-to-station/chamber. Moreover, in some plasma processing applications, some stations/chambers are turned off at times, such that the incoming RF power is distributed to fewer stations/chambers than the total number of stations/chambers in the multi-station/chamber tool. In conventional systems, in order to turn off a station/chamber in a multi-station/chamber tool while other stations/chambers operate, additional RF distribution system hardware is needed, including RF switches and additional passive components. When RF switches and additional passive components are added, each leg of the RF distribution system becomes increasingly imbalanced. A compromise between power balancing from station/chamber-to-station/chamber and improved RF distribution options results in sub-optimal hardware implementation within the RF distribution system. A matching module is disclosed herein to provide an automatic RF matching and integral RF distribution network that is suitable for Multi-Station/Chamber Deposition (MSD) (Sequential and Static) plasma applications that simultaneously matches impedance of distributed loads rather than a single load subject to predefined constraints.

Figure 1:
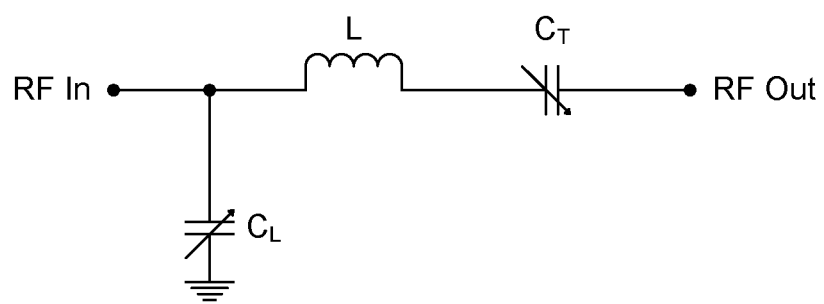
FIG. 1 shows a schematic of a single-output "L" topology RF matching network.

An inflection point in the use of Quad Station/Chamber Module (QSM) systems in the semiconductor industry is an increasing number of plasma processing applications that are not performed in MSSD mode. For example, in some atomic layer deposition (ALD) oxide processes, four wafers are loaded in the QSM system, and all four wafers are processed simultaneously. Then, all four wafers are removed from the QSM system. Plasma processing applications that are not performed in MSSD mode expose some weaknesses in the baseline system that results in station/chamber impedance matching challenges. For example, in some plasma processing applications, the amount of RF power delivered per station/chamber is intentionally offset to compensate for station/chamber-to-station/chamber deposition rate differences. The offset of RF power from station/chamber-to-station/chamber may be accomplished using dedicated RF hardware with recipe-controllable, motorized capacitors that are implemented separate from the RF matching network. This type of offset-capable system introduces eight axes of variable impedance per frequency in addition to the two axes of variable impedance per frequency provided by a single output "L" topology RF matching network. FIG. 1 shows a schematic of the single-output "L" topology RF matching network. The RF matching network of FIG. 1 includes two axes of variable impedance per RF signal frequency. In the RF matching network of FIG. 1, a series load capacitor ($C_L$) is connected in series to an inductor (L). And, downstream of the inductor (L) is a parallel capacitor ($C_T$). Additionally, the RF power delivery arrangement that includes dedicated RF hardware with recipe-controllable, motorized capacitors implemented separate from the RF matching network has a limited ability to match the wide range of impedances that can occur in many processes of interest. The matching module disclosed herein provides for intentional offset of delivered RF power to different stations/chambers to compensate for station/chamber-to-station/chamber deposition rate differences and/or other plasma process parameters, without requiring use of dedicated RF hardware implemented separate from the RF matching module.

Figure 2:
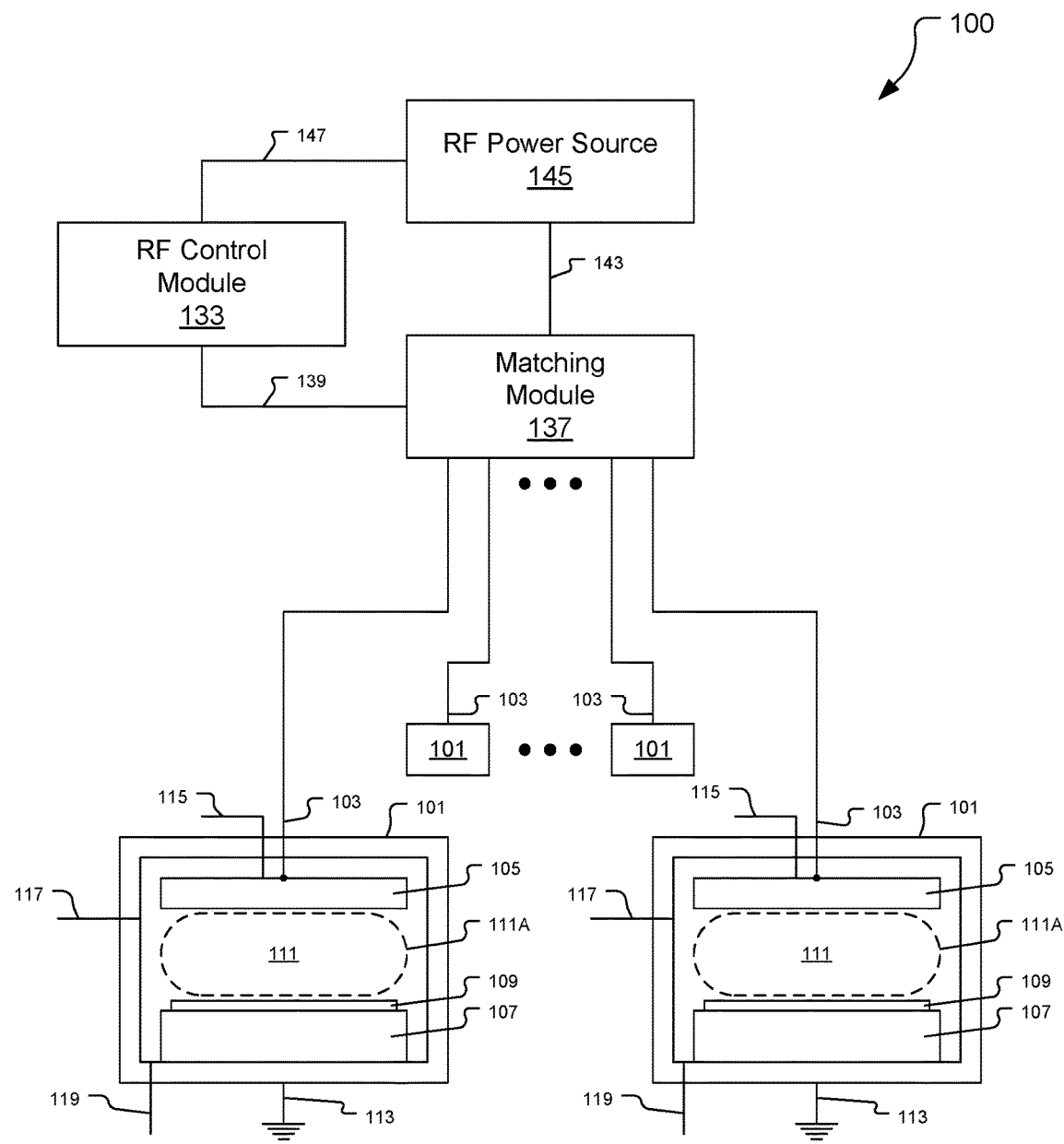
FIG. 2 shows a system for plasma processing of one or more semiconductor substrates, in accordance with some example embodiments of the present invention.

FIG. 2 shows a system 100 for plasma processing of one or more semiconductor substrates, in accordance with some example embodiments of the present invention. The system 100 includes a plurality of plasma processing stations/chambers 101 connected to receive RF signals from an RF power source 145 by way of a matching module 137. Specifically, each of the plurality of plasma processing stations/chambers 101 respectively includes an RF input line 103 through which RF signals are transmitted to generate a plasma 111 within the plasma processing station/chamber 101. The RF signals received through the RF input line 103 are directed to one or more electrodes 105 within the station/chamber 101. The one or more electrodes 105 can include one or more of a top electrode (e.g., a showerhead electrode or solid electrode, among others), a bottom electrode (e.g., an electrostatic chuck or substrate support, among others), and a side electrode (e.g., a peripheral ring-shaped electrode, among others), where the top, bottom, and side electrodes are configured around a plasma processing region 111A.

The example plasma processing stations/chambers 101 of FIG. 2 show the RF input line 103 connected to a top electrode 105, with the top electrode 105 positioned above the plasma processing region 111A. A substrate 109 that is to be subjected to plasma processing within the station/chamber 101 is disposed on a substrate support 107 below the plasma processing region 111A. In various embodiments, the substrate support 107 can be an electrostatic chuck or other type of substrate support member. Also, in various embodiments, the substrate support 107 can be configured to include various cooling mechanisms, heating mechanisms, clamping mechanisms, bias electrodes, and/or sensors, where the sensors can provide for measurement of temperature, pressure, electrical voltage, and/or electrical current, among other parameters. The station/chamber 101 includes an exterior structure formed around the plasma processing region 111A to enclose the top electrode 105 and the substrate support 107. The exterior structure of the station/chamber 101 can be formed of an electrically conductive material and have an electrical connection to reference ground potential 113.

In an example embodiment, the term substrate 109 as used herein refers to a semiconductor wafer. However, it should be understood that in other embodiments, the term substrate 109 as used herein can refer to substrates formed of sapphire, GaN, GaAs or SiC, or other substrate materials, and can include glass panels/substrates, metal foils, metal sheets, polymer materials, or the like. Also, in various embodiments, the substrate 109 as referred to herein may vary in form, shape, and/or size. For example, in some embodiments, the substrate 109 as referred to herein may correspond to a 200 mm (millimeters) semiconductor wafer, a 300 mm semiconductor wafer, or a 450 mm semiconductor wafer. Also, in some embodiments, the substrate 109 as referred to herein may correspond to a non-circular substrate, such as a rectangular substrate for a flat panel display, or the like, among other shapes.

The station/chamber 101 includes one or more process gas input lines 115, 117 configured to direct a controlled flow of one or more process gases into the plasma processing region 111A. In an example embodiment where the top electrode 105 is formed as a showerhead electrode, the process gas input line 115 can be connected to flow process gases to the showerhead electrode, with the showerhead electrode in turn directing the flow of the process gases into the plasma processing region 111A. And, in an example embodiment, the process gas input line 117 can be configured to direct a flow of process gases into the plasma processing region 111A from a side location. The station/chamber 101 also includes an exhaust line 119 connected to provide for removal of fluids (gases and/or liquids) from the interior volume of the station/chamber 101.

It should be understood that the stations/chambers 101 depicted in FIG. 2 and described above are simplified for ease of description. In reality, each of the plurality of plasma processing stations/chambers 101 is a complex system that includes many components not described herein. However, what should be appreciated for the present discussion is that each of the plurality of plasma processing stations/chambers 101 is connected to receive RF signals through one or more RF input lines 103, and is configured to apply the received RF signals to generate the plasma 111 under carefully controlled conditions to produce desired effects on the substrate 109 upon exposure of the substrate 109 to the plasma 111 or to reactive constituents (e.g., ions, radicals, etc.) generated within the plasma 111. Examples of plasma processing operations that may performed by the various plasma processing stations/chambers 101 include etching operations, deposition operations, and ashing operations, among others. Also, it should be understood that the terms chamber and station are used interchangeably herein.

The RF power source 145 is configured to generate RF signals for transmission to the plurality of plasma processing stations/chambers 101. RF signals generated by the RF power source 145 are transmitted through a connection 143 to the matching module 137. In some embodiments, RF signals of different frequency from multiple RF signal generators within the RF power source 145 are combined together by a distribution circuit prior to transmission through the connection 143. The matching module 137 is configured to control impedance matching within the system 100 so that the RF signals generated by the RF power source 145 can be transmitted effectively to the plasma 111 loads within the various plasma processing stations/chambers 101 in a controlled manner. The matching module 137 is also configured to control distribution of the RF signals to the various plasma processing stations/chambers 101 so as to provide a prescribed distribution of an RF signal delivery parameter at the RF input lines 103 of the various plasma processing stations/chambers 101, where the RF signal delivery parameter is either power, phase, current, impedance, voltage, or any combination thereof. Generally speaking, the matching module 137 is a network of capacitors and inductors that can be adjusted to tune impedance encountered by the RF signals in their transmission through the system 100 to the plasma 111 loads within the various plasma processing stations/chambers 101. The matching module 137 has a separate output line for each of the plasma processing stations/chambers 101. From the output lines of the matching module 137, the RF signals are transmitted through the RF input lines 103 to RF delivery components in the various plasma processing stations/chambers 101.

In various embodiments, the RF power source 145 can include one or more RF power sources operating at one or more frequencies. Multiple RF frequencies can be supplied to the same plasma processing station/chamber 101 at the same time. In some embodiments, frequencies of the RF power source 145 are set within a range extending from 1 kHz (kiloHertz) to 100 MHz (megaHertz). In some embodiments, frequencies of the RF power source 145 are set within a range extending from 400 kHz to 60 MHz. In some embodiments, the RF power source 145 is set to generate RF signals at frequencies of 2 MHz, 27 MHz, and 60 MHz. In some embodiments, the RF power source 145 is set to generate one or more high frequency RF signals within a frequency range extending from about 1 MHz to about 60 MHz, and generate one or more low frequency RF signals within a frequency range extending from about 100 kHz to about 1 MHz. It should be understood that the above-mentioned frequency ranges are provided by way of example. In practice, the RF power source 145 can be configured to generate essentially any RF signal having essentially any frequency as needed to generate the plasma 111 within a given plasma processing station/chamber 101. Additionally, the system 100 can include frequency-based filtering, i.e., high-pass filtering and/or low-pass filtering, to ensure that specified RF signal frequencies are transmitted to the matching module 137.

In addition to providing impedance matching, the matching module 137 is also configured and connected to receive the RF signals generated by the RF power source 145 and distribute a respective portion of the RF signals to each RF input line 103 of the plurality of plasma processing stations/chambers 101. In various embodiments, the matching module 137 includes a number of variable capacitors to adjust and control the amount of RF signals delivered to each station/chamber 101. In some embodiments, variable capacitors within the matching module 137 can be controlled by motors and/or switches. The matching module 137 is configured to independently control the amount of RF signals delivered to each of the plurality of plasma processing stations/chambers 101. Also, any number of plasma processing stations/chambers 101 can be connected to receive RF signals from the RF power source 145 by way of the matching module 137. In some scenarios, the matching module 137 can be operated to deliver substantially equal amounts of RF signals to each of the multiple stations/chambers 101, while in other scenarios, the matching module 137 can be operated to deliver distinctly different amounts of RF signals to different ones of the multiple stations/chambers 101. In various embodiments, the RF signals used to generate the plasma 111 from the process gases can range from about 50 Watts to about 500 Watts per station/chamber 101.

Also, in some embodiments, an RF control module 133 is configured to transmit control signals through a connection 147 to the RF power source 145, so as to direct adjustments in the operation of the RF power source 145 in order to achieve a prescribed RF signal delivery to one or more of the stations/chambers 101. Similarly, in some embodiments, the RF control module 133 is configured to transmit control signals through a connection 139 to the matching module 137, so as to direct adjustments in the operation of the matching module 137 in order to achieve a prescribed distribution of an RF signal delivery parameter at the RF input lines 103 of the various plasma processing stations/chambers 101, where the RF signal delivery parameter is either power, phase, current, impedance, voltage, or any combination thereof. Additionally, signals conveying the operational status/condition of the RF power source 145 can be transmitted from the RF power source 145 through the connection 147 to the RF control module 133. And, similarly, signals conveying the operational status/condition of the matching module 137 can be transmitted from the matching module 137 through the connection 139 to the RF control module 133. In this manner, a closed-loop feedback monitoring and control network can be established between the RF control module 133 and each of the RF power source 145 and matching module 137.

Figure 3A:
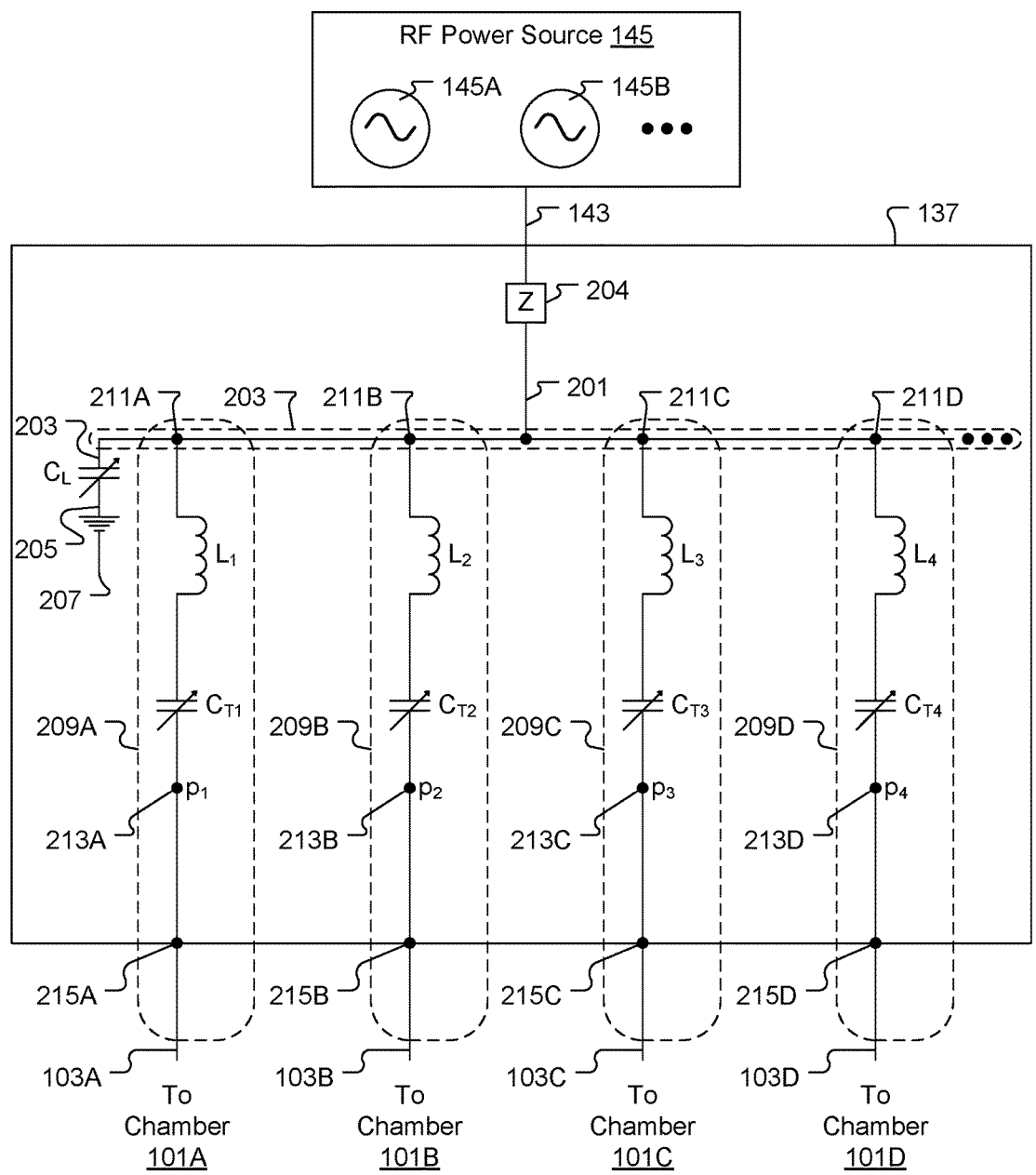
FIG. 3A shows a schematic view of a matching module, in accordance with some embodiments of the present invention.

FIG. 3A shows a schematic view of the matching module 137, in accordance with some embodiments of the present invention. The matching module 137 includes an input terminal 201 connected to receive RF signals from one or more RF generators 145A, 145B of the RF power source 145, through the connection 143. The input terminal 201 is connected to an input node 203. In some embodiments, an optional supplemental impedance 204 is provided on the input terminal 201 to function as a filter network, or a ballasting network, or to supplement a total impedance of the overall matching module 137. It should be understood that in some embodiments the optional supplemental impedance 204 is not present. The matching module 137 includes a load capacitor ($C_L$) that has a first terminal 205 connected to the input node 203 and a second terminal 205 connected to a reference ground potential 207. The load capacitor ($C_L$) is configured as a variable capacitor. The matching module 137 also includes a plurality of RF signal delivery branches 209A, 209B, 209C, 209D, etc., each having a respective ingress terminal 211A, 211B, 211C, 211D, etc., connected to the input node 203, and a respective egress terminal 213A, 213B, 213C, 213D, etc., connected to a respective one of a plurality of output terminals 215A, 215B, 215C, 215D, etc., of the matching module 137. Each of the plurality of output terminals 215A, 215B, 215C, 215D, etc., of the matching module 137 is connected to deliver RF signals to a different one of a plurality of plasma processing stations/chambers 101A, 101B, 101C, 101D, etc., through their respective RF input lines 103A, 103B, 103C, 103D, etc. Each of the plurality of RF signal delivery branches 209A, 209B, 209C, 209D, etc., includes a corresponding inductor ($L_1$, $L_2$, $L_3$, $L_4$, etc.) and a corresponding tuning capacitor ($C_{T1}$, $C_{T2}$, $C_{T3}$, $C_{T4}$, etc.) electrically connected in a serial manner between its ingress terminal 211A, 211B, 211C, 211D, etc., and its egress terminal 213A, 213B, 213C, 213D, etc. Each tuning capacitor ($C_{T1}$, $C_{T2}$, $C_{T3}$, $C_{T4}$, etc.) is configured as a respective variable capacitor.

The example matching module 137 of FIG. 3A shows four RF signal delivery branches 209A, 209B, 209C, 209D connected to delivery RF signals to four plasma processing stations/chambers 101A, 101B, 101C, 101D, respectively. However, it should be understood that in various embodiments, the matching module 137 can include 2, 3, 4, or more RF signal delivery branches 209A, 209B, 209C, 209D. In some embodiments, a number of the plurality of RF signal delivery branches 209A, 209B, 209C, 209D, etc., is equal to a number of the plurality of plasma processing stations/chambers 101A, 101B, 101C, 101D, etc. However, in some embodiments, the number of the plurality of RF signal delivery branches 209A, 209B, 209C, 209D, etc., may be greater than the number of the plurality of plasma processing stations/chambers 101A, 101B, 101C, 101D, etc., with each extra RF signal delivery branch having its egress terminal either unconnected or connected to a reference ground potential.

In some embodiments, the load capacitor ($C_L$) and each tuning capacitor ($C_{T1}$, $C_{T2}$, $C_{T3}$, $C_{T4}$, etc.) of the plurality of RF signal delivery branches 209A, 209B, 209C, 209D, etc., is set to a respective capacitance value that provides a substantial match of an impedance present at the input node 203 with an impedance present at an output of the RF power source 145. Also, in some embodiments, the load capacitor ($C_L$) and each tuning capacitor ($C_{T1}$, $C_{T2}$, $C_{T3}$, $C_{T4}$, etc.) of the plurality of RF signal delivery branches 209A, 209B, 209C, 209D, etc., is set to a respective capacitance value that provides a substantial balance of an RF signal delivery parameter ($p_1$, $p_2$, $p_3$, $p_4$) present at the egress terminals 213A, 213B, 213C, 213D, etc., of the plurality of RF signal delivery branches 209A, 209B, 209C, 209D, etc., where the RF signal delivery parameter ($p_1$, $p_2$, $p_3$, $p_4$) is either power, phase, current, impedance, voltage, or any combination thereof.

In some embodiments, the load capacitor ($C_L$) and each tuning capacitor ($C_{T1}$, $C_{T2}$, $C_{T3}$, $C_{T4}$, etc.) of the plurality of RF signal delivery branches 209A, 209B, 209C, 209D, etc., is set to a respective capacitance value that provides a prescribed distribution of the RF signal delivery parameter ($p_1$, $p_2$, $p_3$, $p_4$) present at the egress terminals 213A, 213B, 213C, 213D, etc., of the plurality of RF signal delivery branches 209A, 209B, 209C, 209D, etc., where the RF signal delivery parameter is either power, phase, current, impedance, voltage, or any combination thereof. In some embodiments, the prescribed distribution of the RF signal delivery parameter ($p_1$, $p_2$, $p_3$, $p_4$) includes at least two of the plurality of RF signal delivery branches 209A, 209B, 209C, 209D, etc., having different values of the RF signal delivery parameter ($p_1$, $p_2$, $p_3$, $p_4$) at their egress terminals 213A, 213B, 213C, 213D, etc.

Also, in some embodiments, one or more of the plurality of RF signal delivery branches 209A, 209B, 209C, 209D, etc., is configured to represent effectively infinite impedance by having its tuning capacitor ($C_{T1}$, $C_{T2}$, $C_{T3}$, $C_{T4}$, etc.) set to a capacitance value that effectively blocks transmission of RF signals through its egress terminal 213A, 213B, 213C, 213D, etc. In this manner, each RF signal delivery branch 209A, 209B, 209C, 209D, etc., having its tuning capacitor ($C_{T1}$, $C_{T2}$, $C_{T3}$, $C_{T4}$, etc.) set to represent effectively infinite impedance is effectively turned off with regard to delivery of RF signals to its corresponding plasma processing stations/chambers 101A, 101B, 101C, 101D, etc., and thereby becomes inactive. The active ones of the plurality of RF signal delivery branches 209A, 209B, 209C, 209D, etc., are not configured to represent effectively infinite impedance, and are thereby configured to provide for transmission of RF signals through their egress terminals 213A, 213B, 213C, 213D, etc.

In some embodiments, the load capacitor ($C_L$) and each tuning capacitor ($C_{T1}$, $C_{T2}$, $C_{T3}$, $C_{T4}$, etc.) of the active ones of the plurality of RF signal delivery branches 209A, 209B, 209C, 209D, etc., are set to a respective capacitance value that provides a substantial balance of the RF signal delivery parameter ($p_1$, $p_2$, $p_3$, $p_4$) present at their egress terminals 213A, 213B, 213C, 213D, etc., where the RF signal delivery parameter ($p_1$, $p_2$, $p_3$, $p_4$) is either power, phase, current, impedance, voltage, or any combination thereof. In some embodiments, the load capacitor ($C_L$) and each tuning capacitor ($C_{T1}$, $C_{T2}$, $C_{T3}$, $C_{T4}$, etc.) of the active ones of the plurality of RF signal delivery branches 209A, 209B, 209C, 209D, etc., are set to a respective capacitance value that provides a prescribed distribution of the RF signal delivery parameter ($p_1$, $p_2$, $p_3$, $p_4$) present at their egress terminals 213A, 213B, 213C, 213D, etc., where the RF signal delivery parameter is either power, phase, current, impedance, voltage, or any combination thereof. In some embodiments, the prescribed distribution of the RF signal delivery parameter ($p_1$, $p_2$, $p_3$, $p_4$) includes at least two active ones of the plurality of RF signal delivery branches 209A, 209B, 209C, 209D, etc., having different values of the RF signal delivery parameter ($p_1$, $p_2$, $p_3$, $p_4$) at their egress terminals 213A, 213B, 213C, 213D, etc.

Figure 3B:
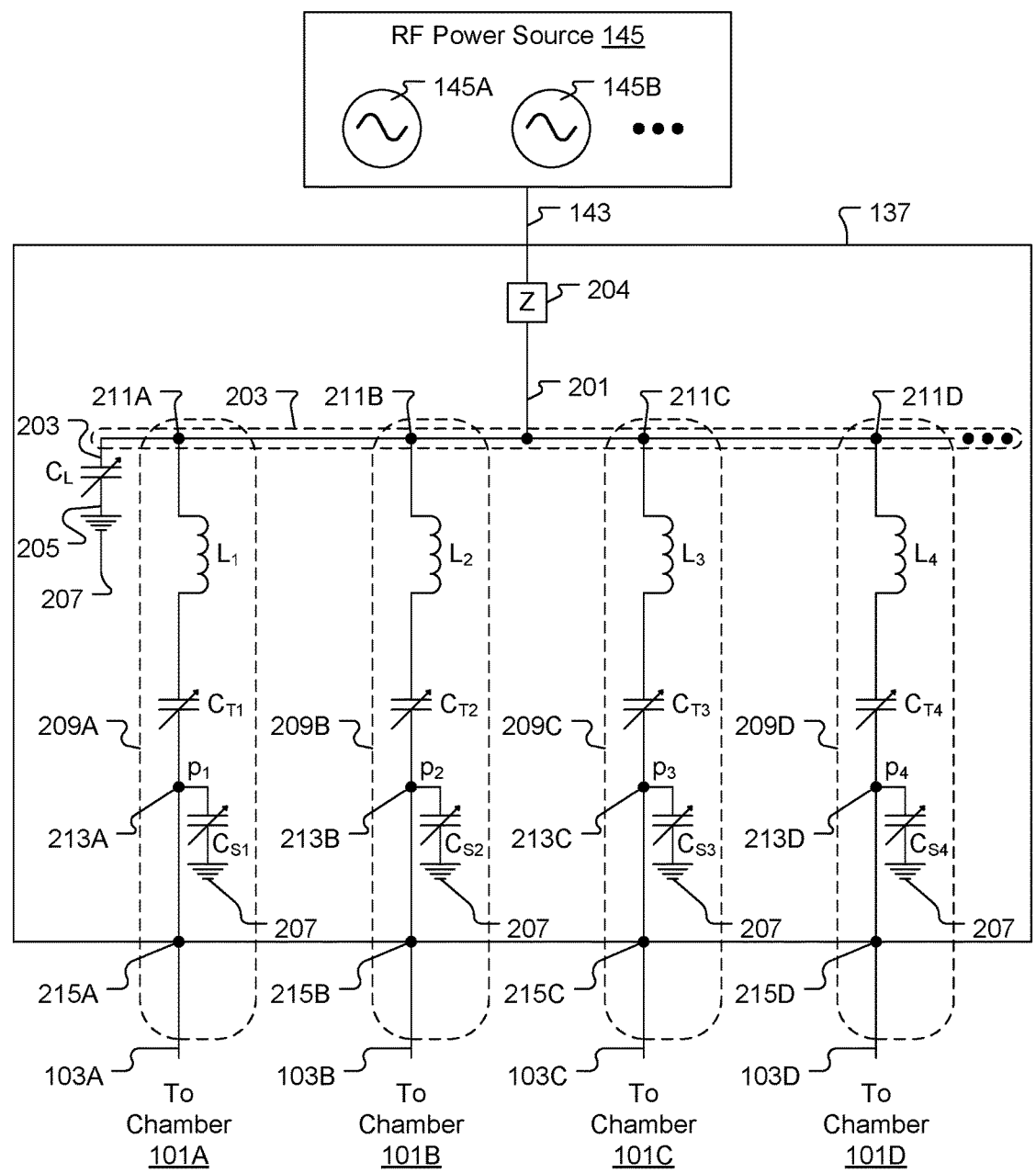
FIG. 3B shows an alternate schematic view of the matching module, in accordance with some embodiments of the present invention.

FIG. 3B shows an alternate schematic view of the matching module 137, in accordance with some embodiments of the present invention. In the matching module 137 of FIG. 3B, each of the plurality of RF signal delivery branches 209A, 209B, 209C, 209D, etc., includes a corresponding balancing capacitor ($C_{S1}$, $C_{S2}$, $C_{S3}$, $C_{S4}$, etc.) electrically connected between its egress terminal 213A, 213B, 213C, 213D, etc., and the reference ground potential 207. Each balancing capacitor ($C_{S1}$, $C_{S2}$, $C_{S3}$, $C_{S4}$, etc.) is configured as a respective variable capacitor. The load capacitor ($C_L$) and each balancing capacitor ($C_{S1}$, $C_{S2}$, $C_{S3}$, $C_{S4}$, etc.) of the plurality of RF signal delivery branches 209A, 209B, 209C, 209D, etc., is set to a respective capacitance value that provides a substantial match of a real component of impedance present at the egress terminals 213A, 213B, 213C, 213D, etc., of the plurality of RF signal delivery branches 209A, 209B, 209C, 209D, etc. In the event of a station/chamber-to-station/chamber difference in the real component of impedance, the balancing capacitors ($C_{S1}$, $C_{S2}$, $C_{S3}$, $C_{S4}$, etc.) can be used to match the real component of the impedance in a different manner for the different stations/chambers, and final matching of the real component of the impedance can be done with the load capacitor ($C_L$). And, each tuning capacitor ($C_{T1}$, $C_{T2}$, $C_{T3}$, $C_{T4}$, etc.) of the plurality of RF signal delivery branches 209A, 209B, 209C, 209D, etc., is set to a respective capacitance value that provides a substantial match of an imaginary component of impedance present at the egress terminals 213A, 213B, 213C, 213D, etc., of the plurality of RF signal delivery branches 209A, 209B, 209C, 209D, etc.

Unlike the single-output RF matching network of FIG. 1, the matching module 137 disclosed herein provides a multiple-output RF automatch network. In a particular embodiment, the matching module 137 is configured to have four output terminals 215A, 215B, 215C, 215D, respectively connected to four plasma processing stations/chambers 101A, 101B, 101C, 101D. The matching module 137 can be viewed as a modified "L" topology having multiple outputs. Because capacitors can be more reliably made into high-cycle variable components, variable capacitors are used in the matching module 137 rather than variable inductors. In the multiple-output matching module 137, each output terminal 215A, 215B, 215C, 215D, etc., has its own degree-of-freedom of control on its RF signal delivery branch 209A, 209B, 209C, 209D, etc., by way of the tuning capacitors ($C_{T1}$, $C_{T2}$, $C_{T3}$, $C_{T4}$, etc.) and a common combined control on the input node 203 by way of the load capacitor ($C_L$). In some example embodiments, the multiple-output matching module 137 is implemented as a "pi" RF automatch network. The multiple-output matching module 137 can match both the line impedance from the RF power source 145, i.e., from the one or more RF generators 145A, 145B, etc., and provide equally balanced RF power output to multiple plasma processing stations/chambers 101A, 101B, 101C, 101D, etc. Additionally, if desired, the multiple-output matching module 137 can provide prescribed unbalanced RF power output to multiple plasma processing stations/chambers 101A, 101B, 101C, 101D, etc. In some plasma processing applications, it is desirable to have an intentional imbalance in RF power distributed to different plasma processing stations/chambers 101A, 101B, 101C, 101D, etc., in order to compensate for other station/chamber-to-station/chamber variation, and in doing so, balance other on-substrate properties such as deposition rate or stress.

Equations 1 and 2 below describe the total RF power ($P_{tot}$) of a multiple station/chamber system, including (n) total stations/chambers.

$$\Sigma_{i=1}^{n} P_i = P_{tot} \quad \text{Equation 1.}$$

$$P_i = w, P_{i+1} = x, \ldots P_n = z | P_i > 0 \quad \text{Equation 2.}$$

For description purposes, consider the embodiment of a four-station/chamber system (n=4) with equal RF power distribution between the four stations/chambers. In this example embodiment, the matching module 137 of FIG. 3A is configured to have four RF signal delivery branches 209A, 209B, 209C, 209D and four corresponding output terminals 215A, 215B, 215C, 215D connected to deliver RF signals to four stations/chambers 101A, 101B, 101C, 101D. In this example embodiment, the matching module 137 includes a total of five axes of tuning corresponding to a combination of the load capacitor ($C_L$) and the four tuning capacitors ($C_{T1}$, $C_{T2}$, $C_{T3}$, $C_{T4}$). In this example embodiment, the total RF power ($P_{tot}$) and power distribution ($P_1$, $P_2$, $P_3$, $P_4$) among the four stations/chambers 101A, 101B, 101C, 101D is characterized as shown in Equations 3 and 4 below.

$$P_1 + P_2 + P_3 + P_4 = P_{tot}. \quad \text{Equation 3}$$

$$P_1 = P_2 = P_3 = P_{4i} = \frac{P_{tot}}{n} = \frac{P_{tot}}{4}. \quad \text{Equation 4}$$

Then, Equation 5 below characterizes the four-station/chamber system with equal RF power distribution between the four stations/chambers.

$$\begin{bmatrix} C_L \\ C_{T1} \\ C_{T2} \\ C_{T3} \\ C_{T4} \end{bmatrix} = \begin{bmatrix} 1 & 1 & 1 & 1 \\ & A & & \end{bmatrix} \begin{bmatrix} P_1 \\ P_2 \\ P_3 \\ P_4 \end{bmatrix}. \quad \text{Equation 5}$$

In Equation 5, the A matrix is created such that the capacitance values of the load capacitor ($C_L$) and each of the tuning capacitors ($C_{T1}$, $C_{T2}$, $C_{T3}$, $C_{T4}$) is based on matching the RF power ($P_1$, $P_2$, $P_3$, $P_4$) delivered to the four stations/chambers. In Equation 5, the A matrix will be full for a typical scenario, but can be represented by a Hermetian matrix (H) with a suitable coordinate transformation such that the A matrix becomes a diagonal matrix (H) as shown in Equation 6 below. Because the load capacitor ($C_L$) is the same for all four stations/chambers, the H matrix has ones for the load capacitor ($C_L$) for all four stations/chambers. And, there is an effective k parameter that is proportional to the power of its station/chamber.

$$\begin{bmatrix} C_L \\ C_{T1} \\ C_{T2} \\ C_{T3} \\ C_{T4} \end{bmatrix} = \begin{bmatrix} 1 & 1 & 1 & 1 \\ & H & & \end{bmatrix} \begin{bmatrix} P_1 \\ P_2 \\ P_3 \\ P_4 \end{bmatrix} = \begin{bmatrix} 1 & 1 & 1 & 1 \\ k & 0 & 0 & 0 \\ 0 & k & 0 & 0 \\ 0 & 0 & k & 0 \\ 0 & 0 & 0 & k \end{bmatrix} \begin{bmatrix} P_1 \\ P_2 \\ P_3 \\ P_4 \end{bmatrix}. \quad \text{Equation 6}$$

A benefit of the above-represented mathematical transformation of decoupled equations is that it enables a single-input, single-output (SISO), Proportional-Integral-Derivative (PID) feedback control to be applied to each of the motorized tuning capacitors ($C_{T1}$, $C_{T2}$, $C_{T3}$, $C_{T4}$, etc.) axes rather than a more complex multiple-input, multiple-output (MIMO) state space control. The RF current ($i_{CT1}$, $i_{CT2}$, $i_{CT3}$, $i_{CT4}$) going through the RF signal delivery branches 209A, 209B, 209C, 209D, respectively, for each station/chamber can be determined as shown in Equation 7. Also, the RF current ($i_{CL}$) going through the load capacitor ($C_L$) can be determined as shown in Equation 7. Then, given i=(C)(dV/dt), the control signal to each motor of the motorized tuning capacitors ($C_{T1}$, $C_{T2}$, $C_{T3}$, $C_{T4}$, etc.) can be determined based on the results of evaluation of Equation 7. It should be appreciated that the capacitance values of the tuning capacitors ($C_{T1}$, $C_{T2}$, $C_{T3}$, $C_{T4}$, etc.) can be set in different combinations to obtain a given distribution of RF currents ($i_{CT1}$, $i_{CT2}$, $i_{CT3}$, $i_{CT4}$) through the different RF signal delivery branches 209A, 209B, 209C, 209D.

Equation 7

$$i_{CT1} = K_p(C_{T1\_d} - C_{T1}) + K_d \frac{d}{dt}(C_{T1\_d} - C_{T1}) + K_i \int (C_{T1\_d} - C_{T1}) dt$$

$$\vdots$$

$$i_{CL} = K_p(P_{tot\_d} - P_{tot}) + K_d \frac{d}{dt}(P_{tot\_d} - P_{tot}) +$$

$$K_i \int (P_{tot\_d} - P_{tot}) dt \Big| P_{tot} = \sum_{i=1}^{n} P_i$$

The scheme described above example works for the case of a multiple-station/chamber system, e.g., two-station/chamber system or more, with intentionally unequal RF signal distribution to different stations/chambers, such as occurs in some modern plasma processing applications. Also, if a MIMO control scheme is used, it is conceivable to have an overconstrained system. In that case, a least squares optimization is possible to mathematically find the best/optimal solution.

In comparison with the RF signal delivery arrangement that includes dedicated RF hardware with recipe-controllable, motorized capacitors implemented separate from the RF matching network so as to form an RF match-plusrecipe-adjustable yet passive RF distribution network, the multiple-output matching module 137 overcomes the complexity and inefficiency of having redundant axes of control while providing for active distribution of a single-input RF source to multiple stations/chambers subject to a number of constraints. In particular, it should be appreciated that the matching module 137 provides this capability with the fewest number of axes of control. With the matching module 137 as disclosed herein, a common RF power source can be used on multiple stations/chambers, and each RF signal delivery branch 209A, 209B, 209C, 209D, etc., can be actively adjusted to balance RF delivery in some cases or to achieve some other optimized but desirable result, such as unbalanced RF delivery in order to compensate for some other station/chamber-to-station/chamber issue(s).

In certain topologies of the matching module 137, such as shown in FIGS. 3A and 3B, having a variable tuning capacitor ($C_{T1}$, $C_{T2}$, $C_{T3}$, $C_{T4}$, etc.) on each RF signal delivery branches 209A, 209B, 209C, 209D, etc., can enable an effective infinite impedance at one end of its range. This function can be used to replace RF switches which are often used to turn stations/chambers off as needed to compensate for a so-called "loading/unloading" effect due to the fact that substrates are often stored in a group quantity that is not evenly divisible by the number of available stations/chambers on the tool being used to process the group of substrates. For example, in some cases substrates are stored in a group of 25 in a front-opening-unified-pod (FOUP), whereas the processing tool has four stations/chambers. In this example, because 25 is not evenly divisible by 4, there is a leftover substrate that must be processed. And, during processing of the leftover substrate on one of the four stations/chambers, the RF power needs to be turned off to the other three stations/chambers that are not operating to process the leftover substrate. Without the matching module 137, it is necessary to implement RF switches to provide for turning off of the RF power to three of the four stations/chambers. However, with the matching module 137, the tuning capacitor ($C_{T1}$, $C_{T2}$, $C_{T3}$, $C_{T4}$, etc.) on each RF signal delivery branch 209A, 209B, 209C, 209D can be set to high impedance to effectively turn off the RF power delivery to any of the four stations/chambers in any combination, so as to eliminate the need for complex and expensive RF switches outside of the matching circuitry.

Figure 4A:
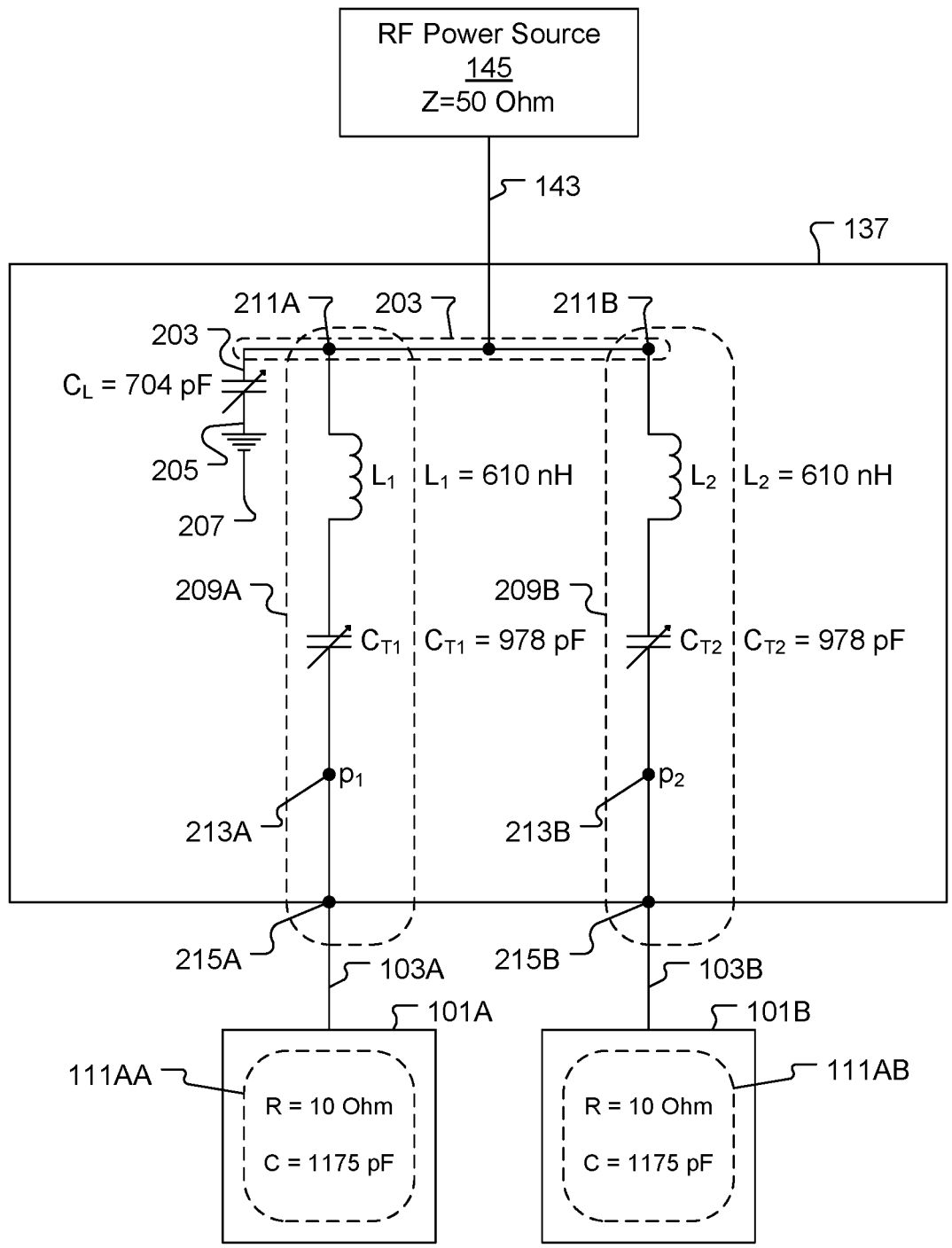
FIG. 4A shows an example implementation of the matching module as shown in FIG. 3A, in accordance with some embodiments of the present invention.

FIG. 4A shows an example implementation of the matching module 137 as shown in FIG. 3A, in accordance with some embodiments of the present invention. In the example of FIG. 4A, the matching module 137 is configured to include two RF signal delivery branches 209A, 209B for delivery of RF signals to two output terminals 215A, 215B, which are respectively connected to two plasma processing stations/chambers 101A, 101B. FIG. 4A shows the matching module 137 in a balanced configuration so as to provide substantially equal values of a given RF signal delivery parameter ($p_1$, $p_2$) at each of the output terminals 215A, 215B, where the given RF signal delivery parameter is either power, phase, current, impedance, voltage, or any combination thereof. Specifically, in the balanced configuration of FIG. 4A, the load capacitor ($C_L$) is set to a capacitance value of 704 picoFarad (pF), and both inductors $L_1$ and $L_2$ are each set to an inductance value of 610 nanoHenry (nH), and the tuning capacitor ($C_{T1}$) of the RF signal delivery branches 209A is set to 978 pF, and the tuning capacitor ($C_{T2}$) of the RF signal delivery branches 209B is set to 978 pF. This configuration of the matching module 137 matches the impedance of 50 Ohm at the output of the RF power source 145. The plasma loads 111AA and 111AB at the two stations/chambers 101A and 101B, respectively, present a substantially equal resistance of about 10 Ohm and a substantially equal capacitance of about 1175 pF, and therefore represent balanced loads.

Figure 4B:
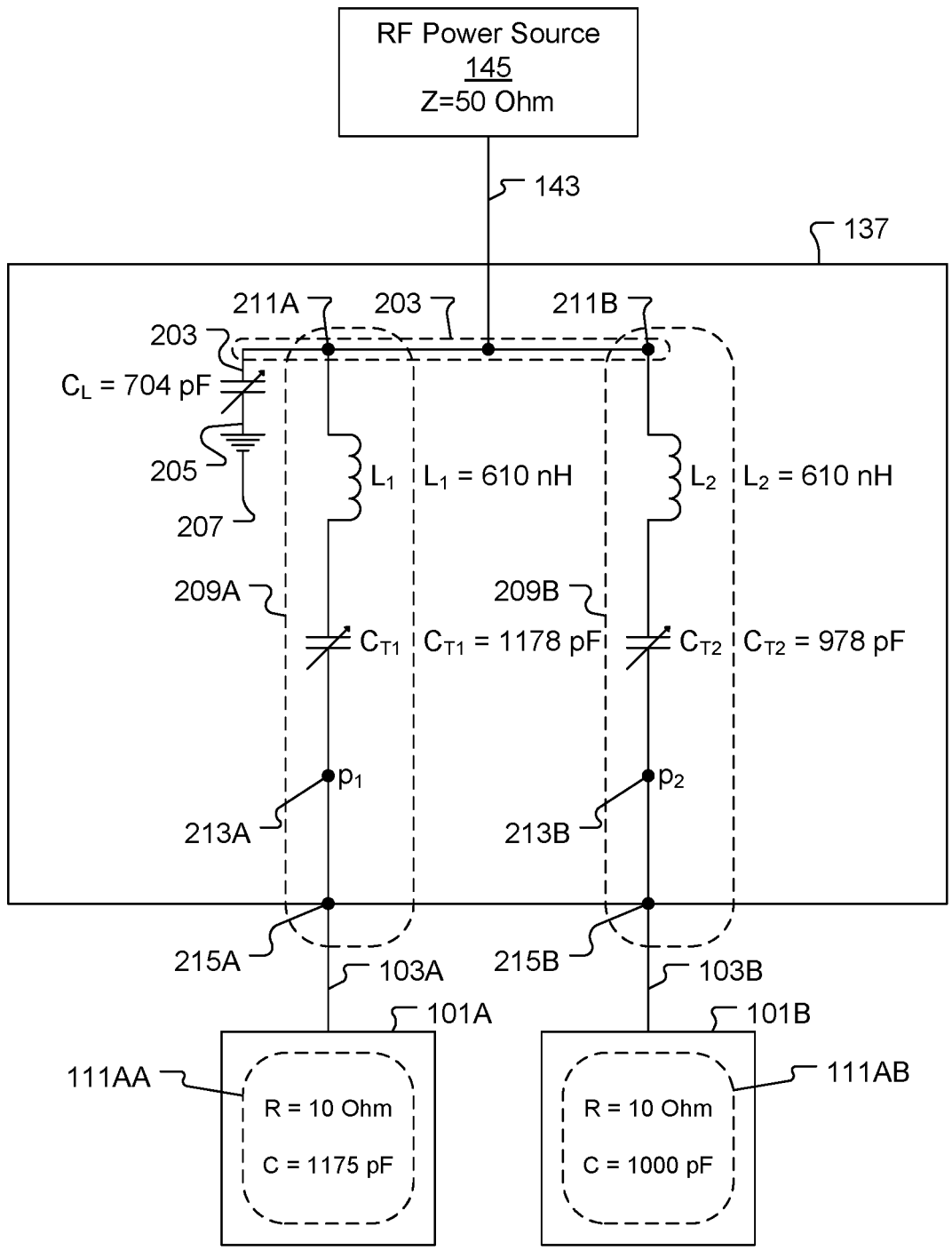
FIG. 4B shows the example implementation of the matching module of FIG. 4A, in which the plasma loads are imbalanced, and in which one of the two tuning capacitors is adjusted to maintain the required impedance match, in accordance with some embodiments of the present invention.

FIG. 4B shows the example implementation of the matching module 137 of FIG. 4A, in which the plasma loads 111AA and 111AB are imbalanced, and in which one of the two tuning capacitors ($C_{T1}$ and $C_{T2}$) is adjusted to maintain the required impedance match, in accordance with some embodiments of the present invention. Specifically, FIG. 4B shows the tuning capacitor ($C_{T1}$) adjusted from 978 pF to 1178 pF to maintain the required impedance match in the presence of the imbalance between the plasma loads 111AA and 111AB.

Figure 4C:
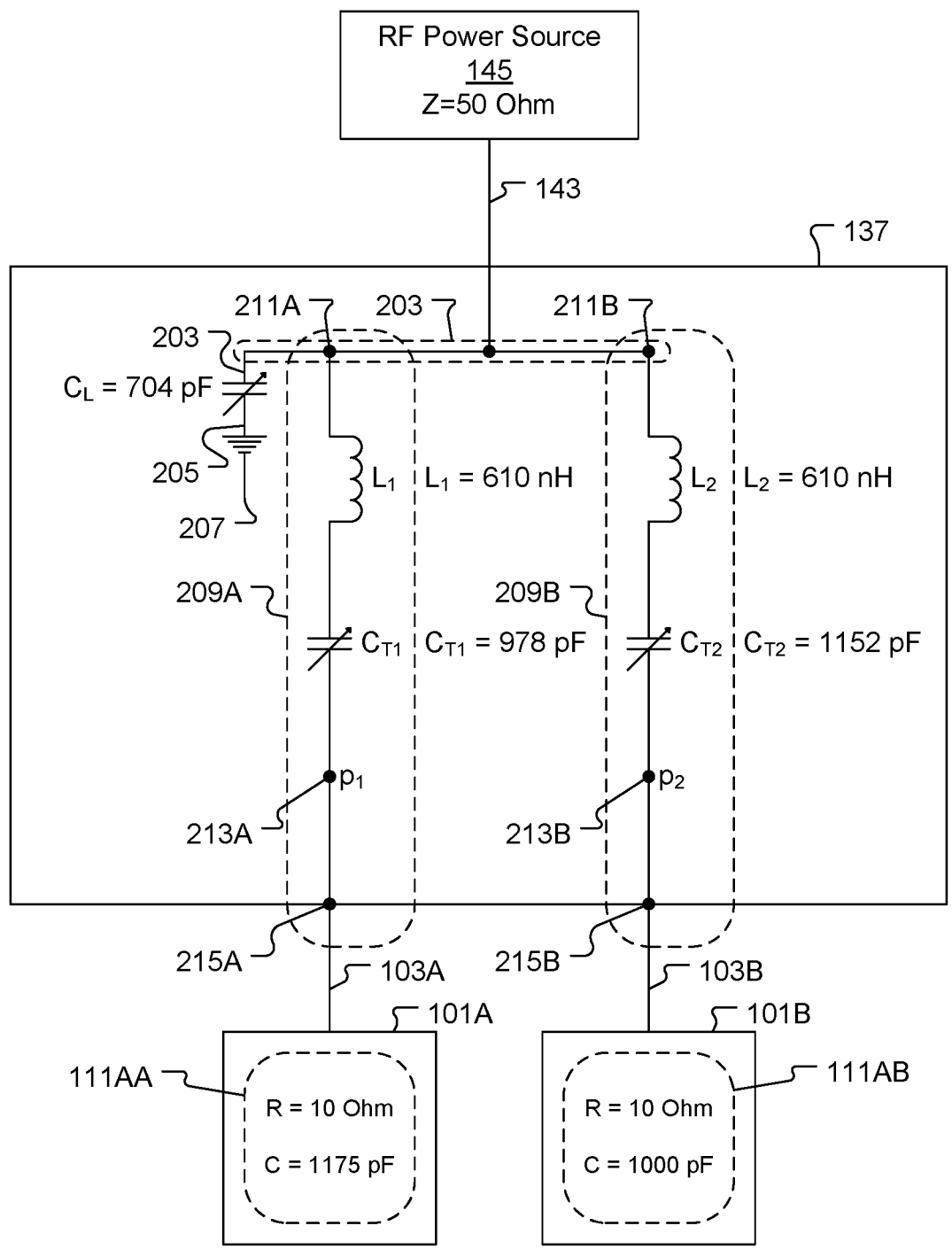
FIG. 4C shows the example implementation of the matching module of FIG. 4A, in which the plasma loads are imbalanced, and in which another one of the two tuning capacitors is adjusted to maintain the required impedance match, in accordance with some embodiments of the present invention.

FIG. 4C shows the example implementation of the matching module 137 of FIG. 4A, in which the plasma loads 111AA and 111AB are imbalanced, and in which another one of the two tuning capacitors ($C_{T1}$ and $C_{T2}$) is adjusted to maintain the required impedance match, in accordance with some embodiments of the present invention. Specifically, FIG. 4B shows the tuning capacitor ($C_{T2}$) adjusted from 978 pF to 1152 pF to maintain the required impedance match in the presence of the imbalance between the plasma loads 111AA and 111AB.

Figure 4D:
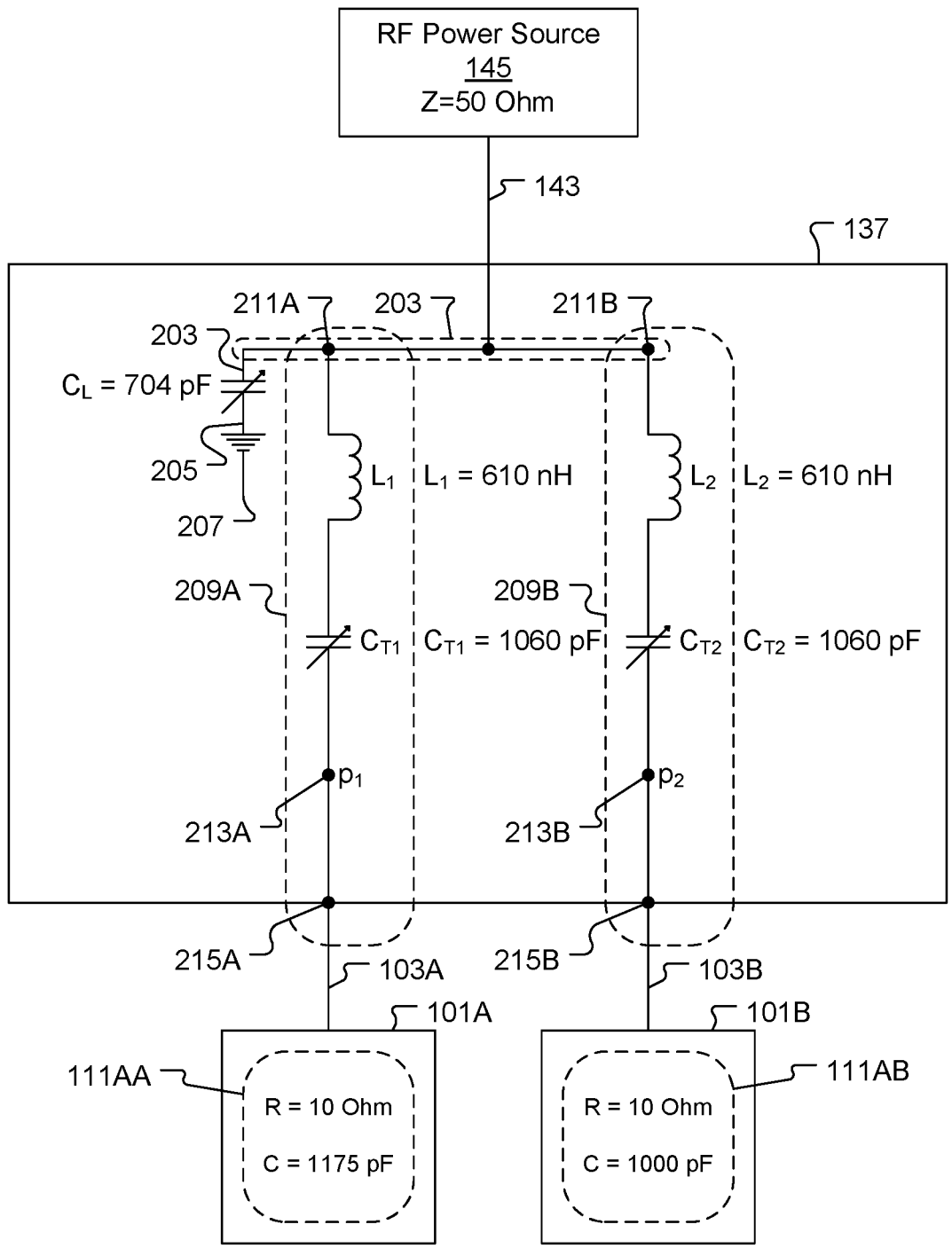
FIG. 4D shows the example implementation of the matching module of FIG. 4A, in which the plasma loads are imbalanced, and in which both of the two tuning capacitors are adjusted to maintain the required impedance match, in accordance with some embodiments of the present invention.

FIG. 4D shows the example implementation of the matching module 137 of FIG. 4A, in which the plasma loads 111AA and 111AB are imbalanced, and in which both of the two tuning capacitors ($C_{T1}$ and $C_{T2}$) are adjusted to maintain the required impedance match, in accordance with some embodiments of the present invention. Specifically, FIG. 4B shows the tuning capacitor ($C_{T1}$) adjusted from 978 pF to 1060 pF and the tuning capacitor ($C_{T2}$) adjusted from 978 pF to 1060 pF to maintain the required impedance match in the presence of the imbalance between the plasma loads 111AA and 111AB. Based on FIGS. 4A, 4B, 4C, and 4D, it should be appreciated that any one or more of the tuning capacitors ($C_{T1}$, $C_{T2}$, $C_{T3}$, $C_{T4}$, etc.) within the matching module 137 can be used to compensate for imbalanced plasma loads. Also, the load capacitor ($C_L$) can be adjusted in combination with the one or more of the tuning capacitors ($C_{T1}$, $C_{T2}$, $C_{T3}$, $C_{T4}$, etc.) within the matching module 137 to compensate for imbalanced plasma loads.

Figure 5:
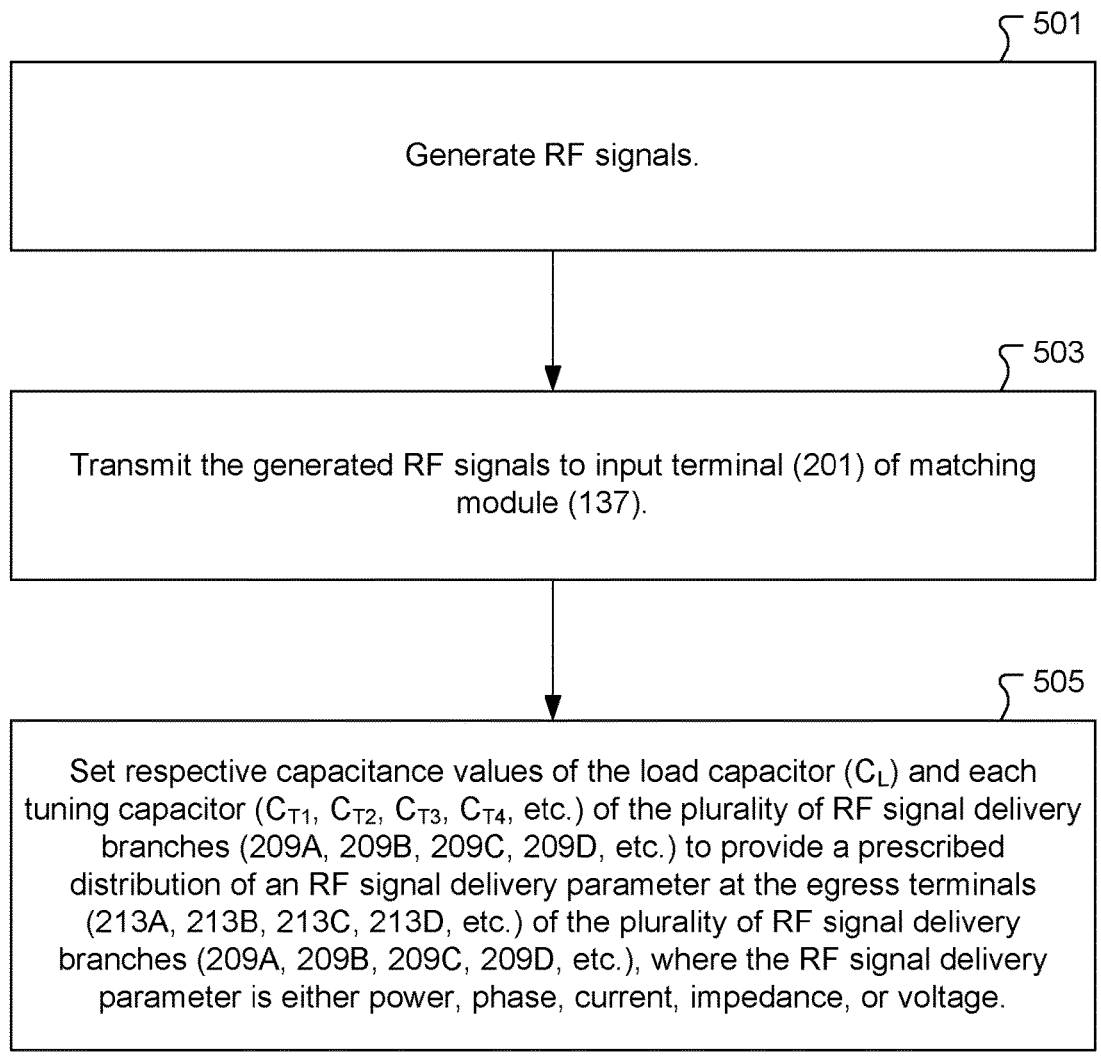
FIG. 5 shows a flowchart of a method for distributing RF signals to a plurality of plasma processing stations/chambers, in accordance with some embodiments of the present invention.

FIG. 5 shows a flowchart of a method for distributing RF signals to a plurality of plasma processing stations/chambers, in accordance with some embodiments of the present invention. The method includes an operation 501 for generating RF signals, such as by operating an RF power source (145). The method also includes an operation 503 for transmitting the generated RF signals to an input terminal (201) of a matching module (137). The matching module (137) includes an input node (203) connected to the input terminal (201). The matching module (137) also includes a load capacitor ($C_L$) having a first terminal (203) connected to the input node (203) and second terminal (205) connected to a reference ground potential (207), where the load capacitor ($C_L$) is configured as a variable capacitor. The matching module (137) also includes a plurality of RF signal delivery branches (209A, 209B, 209C, 209D, etc.) each having a respective ingress terminal (211A, 211B, 211C, 211D, etc.) connected to the input node (203) and a respective egress terminal (213A, 213B, 213C, 213D, etc.) connected to a respective one of a plurality of output terminals (215A, 215B, 215C, 215D, etc.) of the matching module (137). Each of the plurality of output terminals (215A, 215B, 215C, 215D, etc.) of the matching module (137) is connected to deliver RF signals to an RF input line (103A, 103B, 103C, 103D, etc.) of a different one of a plurality of plasma processing stations/chambers (101A, 101B, 101O, 101D, etc.). Each of the plurality of RF signal delivery branches (209A, 209B, 209C, 209D, etc.) includes a corresponding inductor ($L_1$, $L_2$, $L_3$, $L_4$, etc.) and a corresponding tuning capacitor ($C_{T1}$, $C_{T2}$, $C_{T3}$, $C_{T4}$, etc.) electrically connected in a serial manner between its ingress terminal (211A, 211B, 211C, 211D, etc.) and its egress terminal (213A, 213B, 213C, 213D, etc.), where each tuning capacitor ($C_{T1}$, $C_{T2}$, $C_{T3}$, $C_{T4}$, etc.) is configured as a respective variable capacitor. The method also includes an operation 505 for setting respective capacitance values of the load capacitor ($C_L$) and each tuning capacitor ($C_{T1}$, $C_{T2}$, $C_{T3}$, $C_{T4}$, etc.) of the plurality of RF signal delivery branches (209A, 209B, 209C, 209D, etc.) to provide a prescribed distribution of an RF signal delivery parameter at the egress terminals (213A, 213B, 213C, 213D, etc.) of the plurality of RF signal delivery branches (209A, 209B, 209C, 209D, etc.), where the RF signal delivery parameter is either power, phase, current, impedance, voltage, or any combination thereof.

In some embodiments of the method of FIG. 5, the prescribed distribution is a substantial matching of the RF signal delivery parameter at the egress terminals (213A, 213B, 213C, 213D, etc.) of the plurality of RF signal delivery branches (209A, 209B, 209C, 209D, etc.). In some embodiments, the prescribed distribution includes at least two different values of the RF signal delivery parameter at the egress terminals (213A, 213B, 213C, 213D, etc.) of the plurality of RF signal delivery branches (209A, 209B, 209C, 209D, etc.). In some embodiments, setting respective capacitance values of each tuning capacitor ($C_{T1}$, $C_{T2}$, $C_{T3}$, $C_{T4}$, etc.) of the plurality of RF signal delivery branches (209A, 209B, 209C, 209D, etc.) in operation 505 includes setting the tuning capacitor ($C_{T1}$, $C_{T2}$, $C_{T3}$, $C_{T4}$, etc.) of one or more of the plurality of RF signal delivery branches (209A, 209B, 209C, 209D, etc.) to a capacitance value that effectively blocks transmission of RF signals through the egress terminal (213A, 213B, 213C, 213D, etc.) of the one or more of the plurality of RF signal delivery branches (209A, 209B, 209C, 209D, etc.).

In some embodiments, each of the plurality of RF signal delivery branches (209A, 209B, 209C, 209D, etc.) of the matching module (137) includes a corresponding balancing capacitor ($C_{S1}$, $C_{S2}$, $C_{S3}$, $C_{S4}$, etc.) electrically connected between its egress terminal (213A, 213B, 213C, 213D, etc.) and the reference ground potential (207). Each balancing capacitor ($C_{S1}$, $C_{S2}$, $C_{S3}$, $C_{S4}$, etc.) is configured as a respective variable capacitor. The method of FIG. 5 can include setting respective capacitance values of the load capacitor ($C_L$) and each balancing capacitor ($C_{S1}$, $C_{S2}$, $C_{S3}$, $C_{S4}$, etc.) of the plurality of RF signal delivery branches (209A, 209B, 209C, 209D, etc.) to provide a substantial match of a real component of impedance present at the egress terminals (213A, 213B, 213C, 213D, etc.) of the plurality of RF signal delivery branches (209A, 209B, 209C, 209D, etc.). The method of FIG. 5 can also includes setting respective capacitance values of each tuning capacitor ($C_{T1}$, $C_{T2}$, $C_{T3}$, $C_{T4}$, etc.) of the plurality of RF signal delivery branches (209A, 209B, 209C, 209D, etc.) to provide a substantial match of an imaginary component of impedance present at the egress terminals (213A, 213B, 213C, 213D, etc.) of the plurality of RF signal delivery branches (209A, 209B, 209C, 209D, etc.).

Based on the foregoing, it should be understood that the matching module 137 provides for mitigation of RF signal delivery imbalance between multiple stations/chambers, when the plasma processing application specifies that the RF signals are to be delivered in a balanced manner to the multiple stations/chambers, where the balancing of the delivered RF signals can be based on one or more RF signal delivery parameters present at the egress terminals (213A, 213B, 213C, 213D, etc.) of the matching module 137, where the RF signal delivery parameters include power, phase, current, impedance, voltage, or any combination thereof. Therefore, the matching module 137 can be configured and operated to ensure that one station's/chamber's impedance will not drag on another station's/chamber's performance. Also, the matching module 137 provides for minimization of the loading/unloading effect. Within the matching module 137, each RF signal delivery branch (209A, 209B, 209C, 209D, etc.) can be at/around resonance to provide for instant and smooth ignition of the plasma within its corresponding station/chamber. The matching module 137 provides for operation of any number of stations/chambers within the multiple-station/chamber processing system to which the matching module 137 is connected for delivery of RF signals. Therefore, it should be appreciated that the matching module 137 provides for use of a broad range of plasma processing recipes, including 1, 2, 3, 4, or more, station/chamber recipes. Also, the matching module 137 provides for low reflected RF power at both high RF signal frequencies and at low RF signal frequencies.

Figure 6:
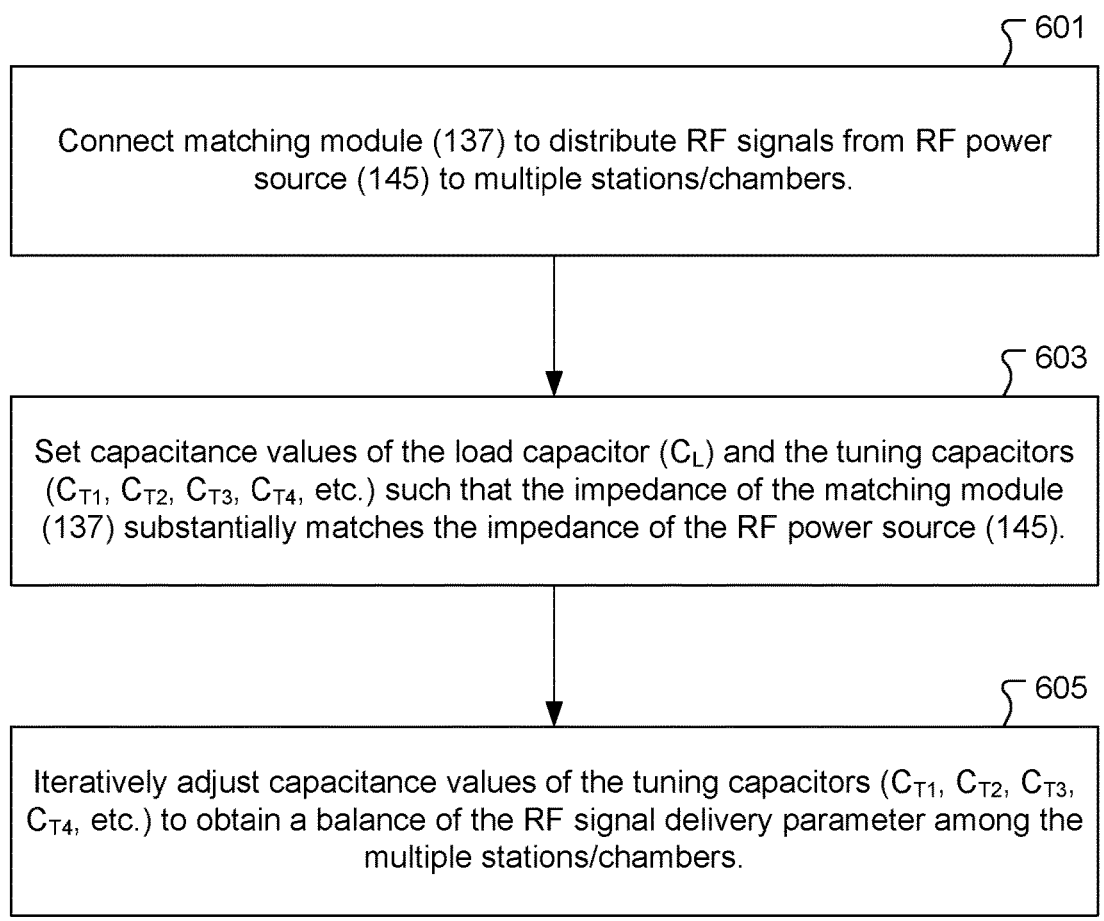
FIG. 6 shows a flowchart of a method for balancing an RF signal delivery parameter among multiple stations/chambers connected to receive RF signals from the matching module, where the RF signal delivery parameter is either power, phase, current, impedance, voltage, or any combination thereof, in accordance with some embodiments of the present invention.

FIG. 6 shows a flowchart of a method for balancing an RF signal delivery parameter among multiple stations/chambers connected to receive RF signals from the matching module (137), where the RF signal delivery parameter is either power, phase, current, impedance, voltage, or any combination thereof, in accordance with some embodiments of the present invention. The method includes an operation 601 for connecting the matching module (137) to distribute RF signals from the RF power source (145) to multiple stations/chambers. The method includes an operation 603 for performing a gang tuning operation in which capacitance values of the load capacitor ($C_L$) and the tuning capacitors ($C_{T1}$, $C_{T2}$, $C_{T3}$, $C_{T4}$, etc.) are set such that the impedance of the matching module (137) substantially matches an impedance of the RF power source (145) from which the RF signals are transmitted to the matching module (137). In the operation 603, each of the tuning capacitors ($C_{T1}$, $C_{T2}$, $C_{T3}$, $C_{T4}$, etc.) is set to the same capacitance value, and the load capacitor ($C_L$) is set to a capacitance value that is either different than or the same as that of the tuning capacitors ($C_{T1}$, $C_{T2}$, $C_{T3}$, $C_{T4}$, etc.). Also, in embodiments where the matching network (137) includes the balancing capacitors ($C_{S1}$, $C_{S2}$, $C_{S3}$, $C_{S4}$, etc.), operation 603 can include setting each of the balancing capacitors ($C_{S1}$, $C_{S2}$, $C_{S3}$, $C_{S4}$, etc.) to have a substantially equal capacitance value, which may be different than or the same as the capacitance values of the load capacitor ($C_L$) and/or the tuning capacitors ($C_{T1}$, $C_{T2}$, $C_{T3}$, $C_{T4}$, etc.).

The method also includes an operation 605 for performing an individual station/chamber tuning process in which the capacitance values of the tuning capacitors ($C_{T1}$, $C_{T2}$, $C_{T3}$, $C_{T4}$, etc.) are iteratively adjusted to obtain a balance of the RF signal delivery parameter among the multiple stations/chambers. During the operation 605, the overall impedance presented by the matching module (137) to the RF power source (145) will remain the same as set in operation 603. However, the values of the RF signal delivery parameter can vary among the multiple stations/chambers. A number of iterations performed in operation 605 is equal to one less than the number of the multiple stations/chambers. That is, if the number of the multiple stations/chambers is (N), then the number of iterations performed in operation 605 is (N−1).

In each iteration of operation 605, the multiple stations/chambers are assessed to determine which station/chamber has a maximum value of the RF signal delivery parameter of interest at the corresponding output terminal (215A, 215B, 215C, 215D, etc.) of the matching module (137), and which station/chamber has a minimum value of the RF signal delivery parameter of interest at the corresponding output terminal (215A, 215B, 215C, 215D, etc.) of the matching module (137). For a given iteration within the operation 605, the station/chamber that has the maximum value of the RF signal delivery parameter of interest is designated as the maximum station/chamber for that given iteration, and the station/chamber that has the minimum value of the RF signal delivery parameter of interest is designated as the minimum station/chamber for that given iteration. Then, in the given iteration within the operation 605, the tuning capacitor ($C_{T1}$, $C_{T2}$, $C_{T3}$, $C_{T4}$, etc.) on the RF signal delivery branch (209A, 209B, 209C, 209D, etc.) that provides delivery of RF signals to the maximum station/chamber is adjusted such that the value of the RF signal delivery parameter of interest at the maximum station/chamber substantially matches the value of the RF signal delivery parameter of interest at the minimum station/chamber. After performing the (N−1) iterations of operation 605, all of the multiple stations/chambers will have substantially the same value for the RF signal delivery parameter of interest.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A matching module, comprising:
an input terminal connected to receive radiofrequency (RF) signals from one or more RF generators, the input terminal connected to an input node;
a load capacitor having a first terminal connected to the input node and second terminal connected to a reference ground potential, wherein the load capacitor is configured as a variable capacitor; and
a plurality of RF signal delivery branches each having a respective ingress terminal connected to the input node and a respective egress terminal connected to a respective one of a plurality of output terminals of the matching module, each of the plurality of output terminals of the matching module connected to deliver RF signals to a different one of a plurality of plasma processing stations/chambers, each of the plurality of RF signal delivery branches including a corresponding inductor and a corresponding tuning capacitor electrically connected in a serial manner between its ingress terminal and its egress terminal, wherein each tuning capacitor is configured as a respective variable capacitor.

2. The matching module as recited in claim 1, wherein a number of the plurality of RF signal delivery branches is equal to a number of the plurality of plasma processing stations/chambers.

3. The matching module as recited in claim 2, wherein the number of plurality of plasma processing stations/chambers is four.

4. The matching module as recited in claim 1, wherein the load capacitor and each tuning capacitor of the plurality of RF signal delivery branches is set to a respective capacitance value that provides a substantial match of an impedance present at the input node with an impedance present at an output of the one or more RF generators.

5. The matching module as recited in claim 1, wherein the load capacitor and each tuning capacitor of the plurality of RF signal delivery branches is set to a respective capacitance value that provides a substantial balance of an RF signal delivery parameter present at the egress terminals of the plurality of RF signal delivery branches, wherein the RF signal delivery parameter is either power, phase, current, impedance, voltage, or any combination thereof.

6. The matching module as recited in claim 1, wherein the load capacitor and each tuning capacitor of the plurality of RF signal delivery branches is set to a respective capacitance value that provides a prescribed distribution of an RF signal delivery parameter present at the egress terminals of the plurality of RF signal delivery branches, wherein the RF signal delivery parameter is either power, phase, current, impedance, voltage, or any combination thereof.

7. The matching module as recited in claim 6, wherein the prescribed distribution of the RF signal delivery parameter includes at least two of the plurality of RF signal delivery branches having different values of the RF signal delivery parameter present at their egress terminals.

8. The matching module as recited in claim 1, wherein one or more of the plurality of RF signal delivery branches is configured to represent effectively infinite impedance by having its tuning capacitor set to a capacitance value that effectively blocks transmission of RF signals through its egress terminal.

9. The matching module as recited in claim 8, wherein the load capacitor and each tuning capacitor of the plurality of RF signal delivery branches that are not configured to represent effectively infinite impedance is set to a respective capacitance value that provides a substantial balance of an RF signal delivery parameter present at the egress terminals of the plurality of RF signal delivery branches that are not configured to represent effectively infinite impedance, wherein the RF signal delivery parameter is either power, phase, current, impedance, voltage, or any combination thereof.

10. The matching module as recited in claim 8, wherein the load capacitor and each tuning capacitor of the plurality of RF signal delivery branches that are not configured to represent effectively infinite impedance is set to a respective capacitance value that provides a prescribed distribution of an RF signal delivery parameter present at the egress terminals of the plurality of RF signal delivery branches that are not configured to represent effectively infinite impedance, wherein the RF signal delivery parameter is either power, phase, current, impedance, voltage, or any combination thereof.

11. The matching module as recited in claim 10, wherein the prescribed distribution of the RF signal delivery parameter includes at least two of the plurality of RF signal delivery branches that are not configured to represent effectively infinite impedance having different values of the RF signal delivery parameter present at their egress terminals.

12. The matching module as recited in claim 1, wherein each of the plurality of RF signal delivery branches includes a corresponding balancing capacitor electrically connected between its egress terminal and the reference ground potential, wherein each balancing capacitor is configured as a respective variable capacitor.

13. The matching module as recited in claim 12, wherein the load capacitor and each balancing capacitor of the plurality of RF signal delivery branches is set to a respective capacitance value that provides a substantial match of a real component of impedance present at the egress terminals of the plurality of RF signal delivery branches, and wherein each tuning capacitor of the plurality of RF signal delivery branches is set to a respective capacitance value that provides a substantial match of an imaginary component of impedance present at the egress terminals of the plurality of RF signal delivery branches.

14. A system for semiconductor substrate processing, comprising:
a plurality of plasma processing stations/chambers, each of the plurality of plasma processing stations/chambers respectively including a radiofrequency (RF) input line through which RF signals are transmitted to generate a plasma within the plasma processing station/chamber;
an RF power source configured to generate RF signals for transmission to the RF input lines of the plurality of plasma processing stations/chambers;
a matching module connected between the RF power source and the RF input lines of the plurality of plasma processing stations/chambers, the matching module including an input terminal connected to receive RF signals from the RF power source, the input terminal connected to an input node within the matching module, the matching module including a load capacitor having a first terminal connected to the input node and second terminal connected to a reference ground potential, wherein the load capacitor is configured as a variable capacitor, the matching module including a plurality of RF signal delivery branches each having a respective ingress terminal connected to the input node and a respective egress terminal connected to a respective one of a plurality of output terminals of the matching module, each of the plurality of output terminals of the matching module connected to deliver RF signals to the RF input line of a different one of a plurality of plasma processing stations/chambers, each of the plurality of RF signal delivery branches including a corresponding inductor and a corresponding tuning capacitor electrically connected in a serial manner between its ingress terminal and its egress terminal, wherein each tuning capacitor is configured as a respective variable capacitor; and
an RF control module configured to transmit control signals to the matching module to control capacitance settings of the load capacitor and the tuning capacitors of the plurality of RF signal delivery branches.

15. The system for semiconductor substrate processing as recited in claim 14, wherein the RF control module is configured to transmit control signals to the RF power source to control transmission of RF signals to the input terminal of the matching module.

16. The system for semiconductor substrate processing as recited in claim 14, wherein within the matching module each of the plurality of RF signal delivery branches includes a corresponding balancing capacitor electrically connected between its egress terminal and the reference ground potential, wherein each balancing capacitor is configured as a respective variable capacitor.

17. A method for distributing radiofrequency (RF) signals to a plurality of plasma processing stations/chambers, comprising:
generating RF signals;
transmitting the generated RF signals to an input terminal of a matching module, the matching module including—
an input node connected to the input terminal,
a load capacitor having a first terminal connected to the input node and second terminal connected to a reference ground potential, wherein the load capacitor is configured as a variable capacitor,
a plurality of RF signal delivery branches each having a respective ingress terminal connected to the input node and a respective egress terminal connected to a respective one of a plurality of output terminals of the matching module, each of the plurality of output terminals of the matching module connected to deliver RF signals to an RF input line of a different one of a plurality of plasma processing stations/chambers, each of the plurality of RF signal delivery branches including a corresponding inductor and a corresponding tuning capacitor electrically connected in a serial manner between its ingress terminal and its egress terminal, wherein each tuning capacitor is configured as a respective variable capacitor; and
setting respective capacitance values of the load capacitor and each tuning capacitor of the plurality of RF signal delivery branches to provide a prescribed distribution of an RF signal delivery parameter at the egress terminals of the plurality of RF signal delivery branches, wherein the RF signal delivery parameter is either power, phase, current, impedance, voltage, or any combination thereof.

18. The method as recited in claim 17, wherein the prescribed distribution is a substantial balancing of the RF signal delivery parameter at the egress terminals of the plurality of RF signal delivery branches.

19. The method as recited in claim 17, wherein the prescribed distribution includes at least two different values of the RF signal delivery parameter at the egress terminals of the plurality of RF signal delivery branches.

20. The method as recited in claim 17, wherein setting respective capacitance values of each tuning capacitor of the plurality of RF signal delivery branches includes setting the tuning capacitor of one or more of the plurality of RF signal delivery branches to a capacitance value that effectively blocks transmission of RF signals through the egress terminal of the one or more of the plurality of RF signal delivery branches.

21. The method as recited in claim 17, wherein within the matching module each of the plurality of RF signal delivery branches includes a corresponding balancing capacitor electrically connected between its egress terminal and the reference ground potential, wherein each balancing capacitor is configured as a respective variable capacitor, wherein the method includes setting respective capacitance values of the load capacitor and each balancing capacitor of the plurality of RF signal delivery branches to provide a substantial match of a real component of impedance present at the egress terminals of the plurality of RF signal delivery branches, and wherein the method includes setting respective capacitance values of each tuning capacitor of the plurality of RF signal delivery branches to provide a substantial match of an imaginary component of impedance present at the egress terminals of the plurality of RF signal delivery branches.

22. A method for balancing a radiofrequency (RF) signal delivery parameter among a plurality of plasma processing stations/chambers, comprising:
operating an RF power source to generate RF signals;

connecting a matching module to distribute the RF signals to a plurality of plasma processing stations/chambers, the matching module including—
  an input node connected to receive the RF signals from the RF power source,
  a load capacitor having a first terminal connected to the input node and second terminal connected to a reference ground potential, wherein the load capacitor is configured as a variable capacitor,
  a plurality of RF signal delivery branches each having a respective ingress terminal connected to the input node and a respective egress terminal connected to a respective one of a plurality of output terminals of the matching module, each of the plurality of output terminals of the matching module connected to deliver RF signals to an RF input line of a different one of a plurality of plasma processing stations/chambers, each of the plurality of RF signal delivery branches including a corresponding inductor and a corresponding tuning capacitor electrically connected in a serial manner between its ingress terminal and its egress terminal, wherein each tuning capacitor is configured as a respective variable capacitor;
setting a capacitance value of the load capacitor and respective capacitance values of each tuning capacitor of the plurality of RF signal delivery branches such that an impedance of the matching module present at the input node substantially matches an impedance at an output of the RF power source, wherein each tuning capacitor is set to a same capacitance value; and
iteratively adjusting the capacitance values of the tuning capacitors of the plurality of RF signal delivery branches to obtain a balance of an RF signal delivery parameter among the plurality of plasma processing stations/chambers, wherein the RF signal delivery parameter is either power, phase, current, impedance, voltage, or any combination thereof.

23. The method as recited in claim 22, wherein iteratively adjusting the capacitance values of the tuning capacitors includes performing (N−1) adjustment iterations, wherein N is equal to a number of the plurality of plasma processing stations/chambers.

24. The method as recited in claim 23, wherein each adjustment iteration includes determining which of the plurality of plasma processing stations/chambers has a maximum value of the RF signal delivery parameter at its corresponding one of the plurality of output terminals of the matching module so as to be a designated a maximum station/chamber for a current adjustment iteration, and
  wherein each adjustment iteration includes determining which of the plurality of plasma processing stations/chambers has a minimum value of the RF signal delivery parameter at its corresponding one of the plurality of output terminals of the matching module so as to be a designated a minimum station/chamber for the current adjustment iteration, and
  wherein each adjustment iteration includes adjusting a capacitance value of the tuning capacitor within the RF signal delivery branch connected to deliver RF signals to the maximum station/chamber such that a value of the RF signal delivery parameter at the maximum station/chamber substantially matches a value of the RF signal delivery parameter at the minimum station/chamber.

* * * * *